US 12,283,585 B2

(12) United States Patent
Chen

(10) Patent No.: US 12,283,585 B2
(45) Date of Patent: Apr. 22, 2025

(54) OPTOELECTRONIC DEVICE PACKAGE AND METHOD OF MANUFACTURING THE SAME

(71) Applicant: Advanced Semiconductor Engineering, Inc., Kaohsiung (TW)

(72) Inventor: Chi-Han Chen, Taoyuan (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/434,703

(22) Filed: Feb. 6, 2024

(65) Prior Publication Data

US 2024/0213233 A1    Jun. 27, 2024

Related U.S. Application Data

(63) Continuation of application No. 17/319,948, filed on May 13, 2021, now Pat. No. 11,894,354.

(51) Int. Cl.
*H01L 25/16*    (2023.01)
*H01L 21/48*    (2006.01)
(Continued)

(52) U.S. Cl.
CPC ........ *H01L 25/167* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2221/68372* (2013.01); *H01L 2224/214* (2013.01)

(58) Field of Classification Search
CPC ..... H01L 2221/68372; H01L 2224/214; H01L 24/19; H01L 24/20; H01L 23/3128; H01L 23/5383; H01L 23/5386; H01L 23/538; H01L 21/4853; H01L 21/4857; H01L 21/565; H01L 21/568; H01L 21/6835; H01L 25/167
See application file for complete search history.

(56) References Cited

U.S. PATENT DOCUMENTS 8,971,676 B1    3/2015  Thacker et al.
9,153,461 B2   10/2015  Henderson et al.
(Continued)

OTHER PUBLICATIONS

Non-Final Office Action for U.S. Appl. No. 17/319,948, issued Apr. 5, 2023, 15 pages.
(Continued)

*Primary Examiner* — Kyoung Lee
*Assistant Examiner* — Christina A Sylvia
(74) *Attorney, Agent, or Firm* — FOLEY & LARDNER LLP

(57) ABSTRACT

An optoelectronic device package includes a first redistribution layer (RDL), a first electronic die disposed over the first RDL, wherein an active surface of the first electronic die faces the first RDL. The optoelectronic device package further includes a second electronic die disposed over the first RDL, and a photonic die disposed over and electrically connected to the second electronic die. An active surface of the second electronic die is opposite to the first RDL.

17 Claims, 13 Drawing Sheets

(51) Int. Cl.
    *H01L 21/56*     (2006.01)
    *H01L 21/683*     (2006.01)
    *H01L 23/00*     (2006.01)
    *H01L 23/31*     (2006.01)
    *H01L 23/538*     (2006.01)

(56) References Cited

U.S. PATENT DOCUMENTS

| | | |
|---|---|---|
| 9,432,121 B2 | 8/2016 | Lesea et al. |
| 11,107,770 B1 | 8/2021 | Ramalingam et al. |
| 11,536,897 B1 | 12/2022 | Thompson et al. |
| 2016/0216445 A1 | 7/2016 | Thacker et al. |
| 2016/0260684 A1* | 9/2016 | Zhai .................. H01L 25/0652 |
| 2017/0309606 A1* | 10/2017 | Lee .................. H01L 23/49827 |
| 2018/0102470 A1* | 4/2018 | Das .................. H01L 23/5384 |
| 2018/0145049 A1* | 5/2018 | Lin .................. H01L 21/6835 |
| 2018/0188448 A1* | 7/2018 | Yim .................. H01L 23/3675 |
| 2018/0350751 A1* | 12/2018 | Sun .................. H05K 7/20454 |
| 2019/0041594 A1 | 2/2019 | Li et al. |
| 2019/0137706 A1 | 5/2019 | Xie |
| 2019/0244905 A1* | 8/2019 | Yu .................. H01L 23/5383 |
| 2019/0317287 A1 | 10/2019 | Raghunathan et al. |

OTHER PUBLICATIONS

Notice of Allowance for U.S. Appl. No. 17/319,948, issued Sep. 27, 2023, 10 pages.

\* cited by examiner

OPTOELECTRONIC DEVICE PACKAGE AND METHOD OF MANUFACTURING THE SAME

CROSS-REFERENCE TO RELATED APPLICATION

This application is a continuation of U.S. patent application Ser. No. 17/319,948, filed May 13, 2021, now U.S. Pat. No. 11,894,354, the content of which is incorporated herein by reference in its entirety.

BACKGROUND

1. Technical Field

The present disclosure relates generally to a semiconductor substrate structure and a method of manufacturing a semiconductor package structure.

2. Description of the Related Art

The demand for network information has been increasing year-by-year for implementing Cloud services, Internet of Things (IoT), 5G applications, etc. Such applications require high data transmission speed. Operating at higher and higher speeds and frequencies, traditional cable transmission have signal integrity issues due to the high impedance generated by capacitance and inductance characteristics of traditional cables. Signal integrity issues negatively impact transmission distance and power loss performance of traditional cable transmission systems. In recent years, optical communication is often used to replace traditional cable transmission. In optical communication, optical fibers are used to replace electrically conductive wire among devices.

SUMMARY

In some arrangements, an optoelectronic device package includes a first redistribution layer (RDL), a processing die and an input/output (I/O) die. The processing die and the I/O die are electrically connected to each other through the first RDL.

In some arrangements, an optoelectronic device package includes a first redistribution layer (RDL), a first electronic die disposed over the first RDL, wherein an active surface of the first electronic die faces the first RDL. The optoelectronic device package further includes a second electronic die disposed over the first RDL, and a photonic die disposed over and electrically connected to the second electronic die. An active surface of the second electronic die is opposite to the first RDL.

In some arrangements, a method of manufacturing an optoelectronic device package includes providing a redistribution layer (RDL), disposing a switch die on the RDL, and disposing an I/O die on the RDL, wherein the switch die and the I/O die are side-by-side arranged on the RDL.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
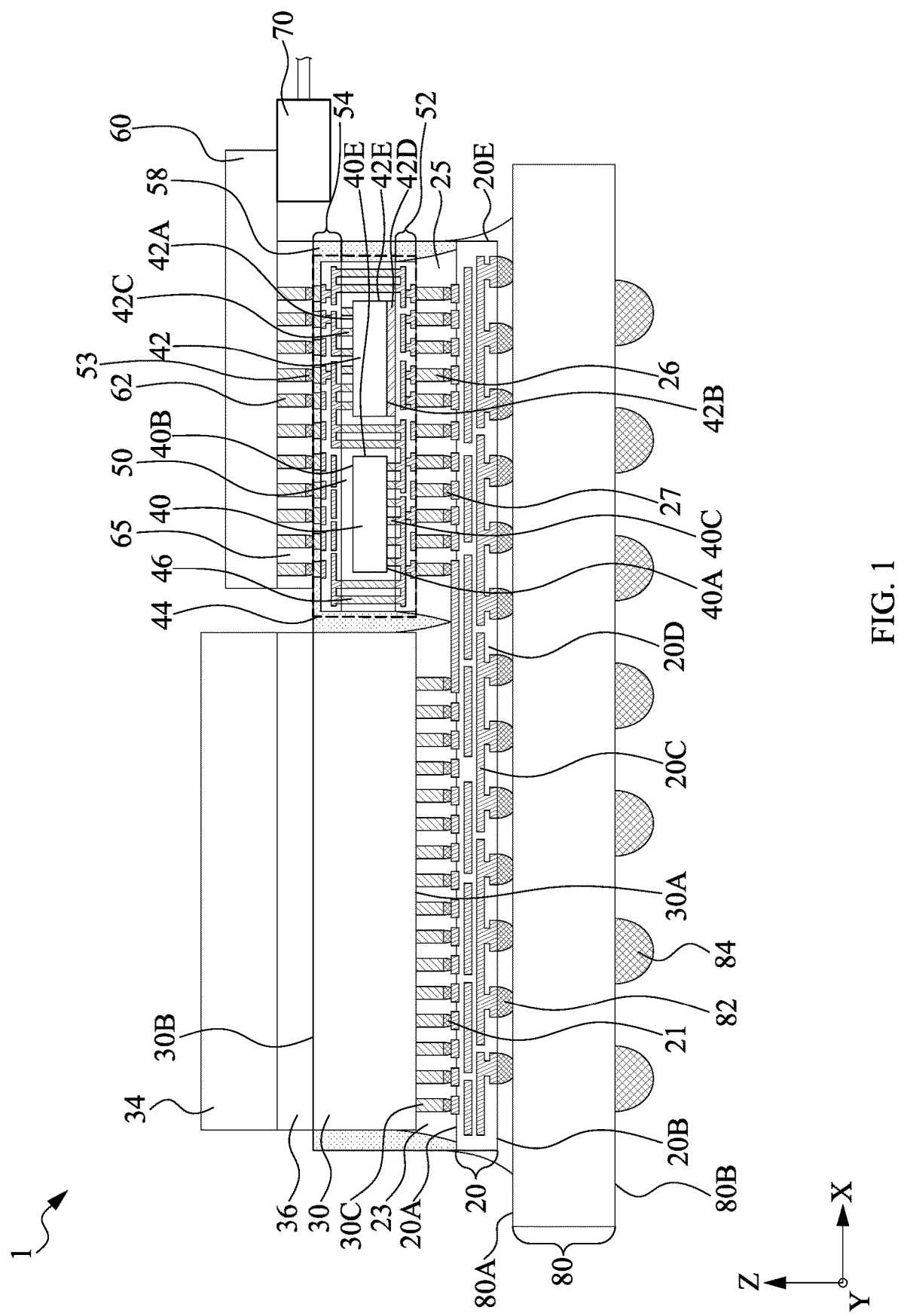
FIG. 1 illustrates a cross-sectional view of an optoelectronic device package in accordance with some arrangements of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides for many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

In view of the continuous growing demand for higher speed and frequency, the arrangements disclosed herein allow shortening of the transmission distance of signal traces within equipment to avoid signal integrity at high speed.

As used herein, "active surface" refers to a surface of an electronic die on which contact terminals such as contact pads, bonding pads, and conductive structures are disposed. Further, "inactive surface" refers to a surface of an electronic die on which no contact terminals such as contact pads, bonding pads, and conductive structures are disposed.

FIG. 1 illustrates a cross-sectional view of an optoelectronic device package 1 in accordance with some arrangements of the present disclosure. The optoelectronic device package 1 includes a first redistribution layer (RDL) 20 and a plurality of electronic dies. The RDL 20 includes a first surface (e.g., top surface) 20A, and a second surface (e.g., bottom surface) 20B opposite to the first surface 20A. In some arrangements, the RDL 20 may be, but is not limited to, a multi-layered RDL including conductive layers 20C and dielectric layers 20D stacked alternately. The conductive layers 20C and the dielectric layers 20D are configured to electrically connect electronic components disposed on the first surface 20A and the second surface 20B. By way of examples, signals and/or power can be transferred between the electronic components disposed on the first surface 20A and the second surface 20B through the conductive layers 20C and the dielectric layers 20D. The material of the dielectric layer(s) 20D may include polymeric material such as Polybenzoxazoles (PBO), benzocyclobutene or so on. In addition, the dielectric layer 20D of the first RDL 20 has a thickness of micrometer (μm)-level. By virtue of the polymeric dielectric layer 20D having μm-level thickness, the parasitic capacitance between the conductive traces of the conductive layer 20C of the first RDL 20 is smaller than the parasitic capacitance in another circuit layer with inorganic dielectric layer having thinner thickness. Accordingly, signal cross-talk between the conductive lines of the conductive layer 20C of the first RDL 20 can be minimized. The electronic dies may include dies for implementing different functionalities and/or different technology nodes. The technology node (also known as process node, process technology or simply node) refers to a specific semiconductor manufacturing process and its design rules. Generally, the smaller the technology node means the smaller the feature size, producing smaller transistors which are both faster and more power-efficient. For example, the optoelectronic device package 1 may include one or more processing die 30 and a first electronic die including an input/output circuit such as one or more I/O die 40. In some arrangements, the technology node and/or area of the processing die 30 may be smaller than that of the I/O die 40. The area refers to a region that a die occupies in X-Y plane. In some arrangements, the processing die 30 may be a chip, and the I/O die 40 may be a plurality of chiplets electrically connected to the processing die 30. The processing die 30 and the I/O die 40 may be manufactured individually and separately such that manufacturing costs can be minimized and manufacturing efficiency can be maximized. In some arrangements, the processing die 30 may include an application specific integrated circuit (ASIC) die such as a switch die for selecting channels for data communication. The I/O die 40 may include a transceiver including a physical-layer circuit or a physical-layer interface portion (normally abbreviated as "PHY"), which connects a physical medium through which data is conveyed to and from the I/O die 40 to the process die 30. In some arrangements, the I/O die 40 may include a Serializer-Deserializer (SERDES) die. The SERDES die may be used in high speed communications to convert data between serial data and parallel interfaces in order to minimize the number of I/O pins and interconnects. The processing die 30 and the I/O die 40 are arranged side-by-side on the first RDL 20 (aligned along an axis parallel to a direction in which the first RDL 20 extends) and electrically connected to each other through the first RDL 20. In some embodiments, no other active die and/or passive die is disposed between the processing die 30 and the I/O die 40.

In some arrangements, the processing die 30 includes an active surface 30A and an opposing surface 30B opposite to the active surface 30A. The surface 30B may, but is not limited to, be an inactive surface of the processing die 30. In some arrangements, the processing die 30 may include a plurality of electrical connectors 30C such as conductive studs, conductive pads, conductive pillars or so on connected to and/or exposed from the active surface 30A. The electrical connectors 30C may be disposed between the processing die 30 and the first RDL 20 for electrically connecting the processing die 30 to the first RDL 20. In some arrangements, the electrical connectors 30C are electrically connected to the first RDL 20 through a conductive material 21 (such as solder material or so on) and protected by an underfill layer 23. As shown, the underfill layer 23 surrounds lateral surfaces of the electrical connectors 30C and the conductive material 21, and the electrical connectors 30C and the conductive material 21 are embedded in the underfill layer 23.

The I/O die 40 includes an active surface 40A and an opposing surface 40B opposite to the active surface 40A. The opposite surface 40B may, but is not limited to, be an inactive surface of the I/O die 40. The I/O die 40 may include a plurality of electrical connectors 40C such as conductive studs, conductive pads, conductive pillars, or so on connected to and/or exposed from the active surface 40A. The active surface 30A of the processing die 30 and the active surface 40A of the I/O die 40 may be closer to the first RDL 20 than the opposing surface 30B of the processing die 30 and the opposing surface 40B of the I/O die 40. The active surface 30A of the processing die 30 and the active surface 40A of the I/O die 40 may face the first RDL 20. The processing die 30 and the I/O die 40 are in electrical communication with each other through the first RDL 20. Accordingly, the signal transmission path (through the first RDL 20) between the processing die 30 and the I/O die 40 is reduced, and the electrical communication between the processing die 30 and the I/O die 40 is improved. The first RDL 20 may include a bumping-level RDL with fine line width/spacing (L/S). L/S is defined as a minimum value of a line width and a line spacing of a circuit layer. By way of example, the L/S of the first RDL 20 may, but is not limited to, be between about 2 μm/about 2 μm and about 10 μm/about 10 μm. The fine L/S can implement parallel signal transmission between the processing die 30 and the I/O die 40. In some arrangements, the first RDL 20 is a non-semiconductor-based RDL.

In some arrangements, the optoelectronic device package 1 may further include a second electronic die including an electronic integrated circuit such as an electronic integrated circuit (EIC) die 42 arranged on the first RDL 20 side-by-side with the I/O die 40. The EIC die 42 includes an active surface 42A and an opposing surface 42B. The active surface 42A of the EIC die 42 is farther from the first RDL 20 than the opposing surface 42B of the EIC die 42. The opposing surface 42B of the EIC die 42 may face the first RDL 20. The EIC die 42 may include a plurality of electrical connectors 42C such as conductive studs, conductive pads, conductive pillars, or so on connected to and/or exposed from the active surface 42A. In some arrangements, the EIC die 42 is bonded to the first RDL 20 by a die attach film (DAF) 42D.

In some arrangements, the I/O die 40 and the EIC die 42 are collectively encapsulated by a same first encapsulation layer 50, forming an encapsulated electronic device 44. The electrical connectors 42C of the EIC die 42 may be exposed from the first encapsulation layer 50. In some arrangements, the optoelectronic device package 1 may further include a second RDL 52 and a third RDL 54. The second RDL 52 may be disposed under the I/O die 40 and the EIC die 42. The second RDL 52 is connected to the active surface 40A of the I/O die 40. The third RDL 54 may be disposed over the I/O die 40 and the EIC die 42. The third RDL 54 may be electrically connected to the active surface 42A of the EIC die 42. The second RDL 52 and the third RDL 54 may include a bumping-level RDL having an L/S between about 2 μm/about 2 μm and about 10 μm/about 10 μm, but is not limited thereto.

In some arrangements, the I/O die 40 may be disposed between the processing die 30 and the EIC die 42. The edge 20E of the first RDL 20 protrudes out of the outer edge 42E of the EIC die 42 in a direction away from the I/O die 40.

In some arrangements, the optoelectronic device package 1 may further include a plurality of electrical connectors 26 such as conductive pads, conductive pillars, or so on disposed between and electrically connected to the first RDL 20 and the second RDL 52. The electrical connectors 26 may be electrically connected to the first RDL 20 through a conductive material 27 such as solder material, and protected by an underfill layer 25. In some arrangements, a signal transmission path (a path of which signals are transmitted) between the processing die 30 and the I/O die 40 is through the electrical connectors 30C, the first RDL 20, the electrical connectors 26, and the second RDL 52. In some arrangements, the pitch of the electrical connectors 26 is fine, and the electrical connection between the first RDL 20 and the second RDL 52 may be implemented in a solder-free manner to meet the fine pitch design. For example, the electrical connectors 26 and the first RDL 20 may be directly bonded without the conductive material 27. In some arrangements, the bonding between the electrical connectors 26 and the first RDL 20 may be implemented by metal-to-metal bonding, hybrid bonding, or so on.

In some arrangements, the optoelectronic device package 1 may further include a plurality of through vias 46 such as through mold vias (TMVs) through the first encapsulation layer 50. The plurality of through vias 46 are electrically connected the second RDL 52 to the third RDL 54. In some arrangements, a signal transmission path between the processing die 30 and the EIC die 42 is through the electrical connectors 30C, the first RDL 52, the electrical connectors 26, the second RDL 52, the through vias 46 and the third RDL 54.

In some arrangements, a projection (e.g., an extension) of at least one of an edge 40E of the I/O die 40 or at least an edge 42E of the EIC die 42 is within a range of the first RDL 20. In other words, an extension of at least one of the edge 40E or the edge 42E toward the first RDL 20 (in the vertical direction shown in FIG. 1) traverses the first RDL 20. From a top perspective, the edge 20E of the first RDL 20 may appear to be protruding out of at least one of the outer edge 40E or the edge 42E in a direction away from the processing die 30, from underneath the at least one of the outer edge 40E or the edge 42E. In some arrangements, a width of the first RDL 20 is larger than a width of the second RDL 52 or a width of the third RDL 54.

In some arrangements, the optoelectronic device package 1 may further include a second encapsulation layer 58 encapsulating the encapsulated electronic device 44 and the processing die 30. The second encapsulation layer 58 may expose the opposing surface 30B of the processing die 30. The optoelectronic device package 1 may further include a lid 34, and a thermal interface material (TIM) 36 disposed between the lid 34 and the processing die 30 to improve heat dissipation. The optoelectronic device package 1 may further include a photonic die 60 disposed over the third RDL 54, and a plurality of electrical connectors 62 disposed between and electrically connected to the photonic die 60 and the third RDL 54. In some arrangements, the photonic die 60 may include lasers, receivers, waveguides, detectors, semiconductor optical amplifiers (SOA), gratings, and other active and passive semiconductor optical devices. In some arrangements, the electrical connectors 62 are electrically connected to the third RDL 54 through a conductive material 53 such as solder material or so on, and protected by an underfill layer 65. In some arrangements, a signal transmission path between the photonic die 60 and the EIC die 42 is through the electric connectors 62, the conductive material 53 and the third RDL 54.

In some arrangements, the optoelectronic device package 1 may further include an optical component 70 such as an optical fiber. In some arrangements, from the top view, at least a portion of the optical waveguide of the photonic die 60 may be exposed or protrudes from the bottom surface of the photonic die 60 (the bottom surface of the photonic die 60 facing the EIC die 42) for coupling lights from or into the optical component 70. In such a case, a portion of the photonic die 60 may protrude out of an edge of the encapsulated electronic device 44 (from the top perspective) for receiving the optical component 70. The optical component 70 may be operatively coupled to the portion of the photonic die 60. In some other arrangements, the optical waveguide may be exposed from the side surface of the photonic die 60 instead of the bottom surface or the top surface opposite to the bottom surface.

In some arrangements, the optoelectronic device package 1 may further include a substrate 80, and a plurality of electrical connectors 82 disposed between and electrically connected to the first RDL 20 and the substrate 80. The substrate 80 may include a package substrate having a top surface 80A and a bottom surface 80B. In some arrangements, the second surface (bottom surface) of the first RDL 20 faces the top surface 80A and is higher than the top surface 80A. The electrical connectors 82 may include solder connectors such as solder balls or so on. In some arrangements, external connectors 84 such as solder balls may be disposed on the bottom surface 80B of the substrate 80 to electrically connect to a circuit board such as a printed circuit board (PCB).

In some arrangements of the present disclosure, integrated circuit with larger technology node and/or larger area (e.g., the I/O die 40) is separated from integrated circuit with smaller technology node and/or smaller area (e.g., the processing die 30) to from individual electronic dies. Accordingly, the performance and manufacturing costs of the electronic dies can be individually optimized. The separated dies are electrically connected to each other through an RDL with fine L/S, which can implement high speed parallel signal transmission.

The optoelectronic device packages and manufacturing methods of the present disclosure are not limited to the above-described arrangements, and may be implemented according to other arrangements. To streamline the description and for the convenience of comparison between various arrangements of the present disclosure, similar components of the following arrangements are marked with same numerals, and may not be redundantly described.

Figure 2A:
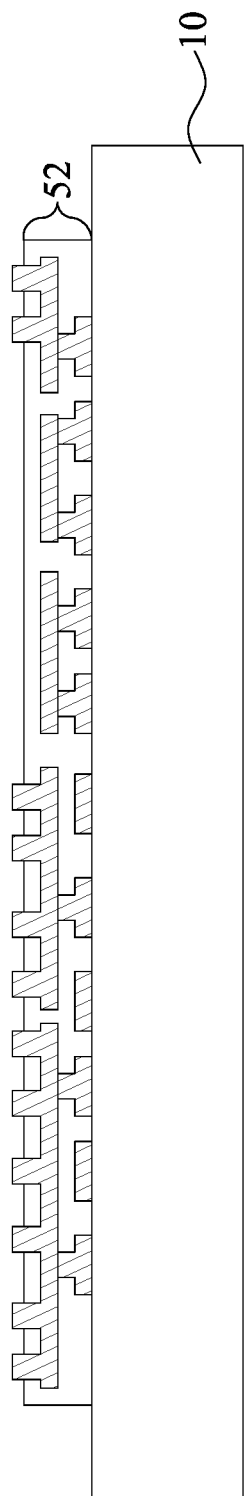
FIG. 2A, FIG. 2B, FIG. 2C, FIG. 2D and FIG. 2E illustrate operations of manufacturing an optoelectronic device package in accordance with some arrangements of the present disclosure.

FIG. 2A, FIG. 2B, FIG. 2C, FIG. 2D and FIG. 2E illustrate operations of manufacturing an optoelectronic device package in accordance with some arrangements of the present disclosure. As shown in FIG. 2A, a carrier 10 is provided. A second RDL 52 is formed on the carrier 10. In some arrangements, the second RDL 52 may be formed by alternately stacking conductive layers and dielectric layers.

Figure 2B:
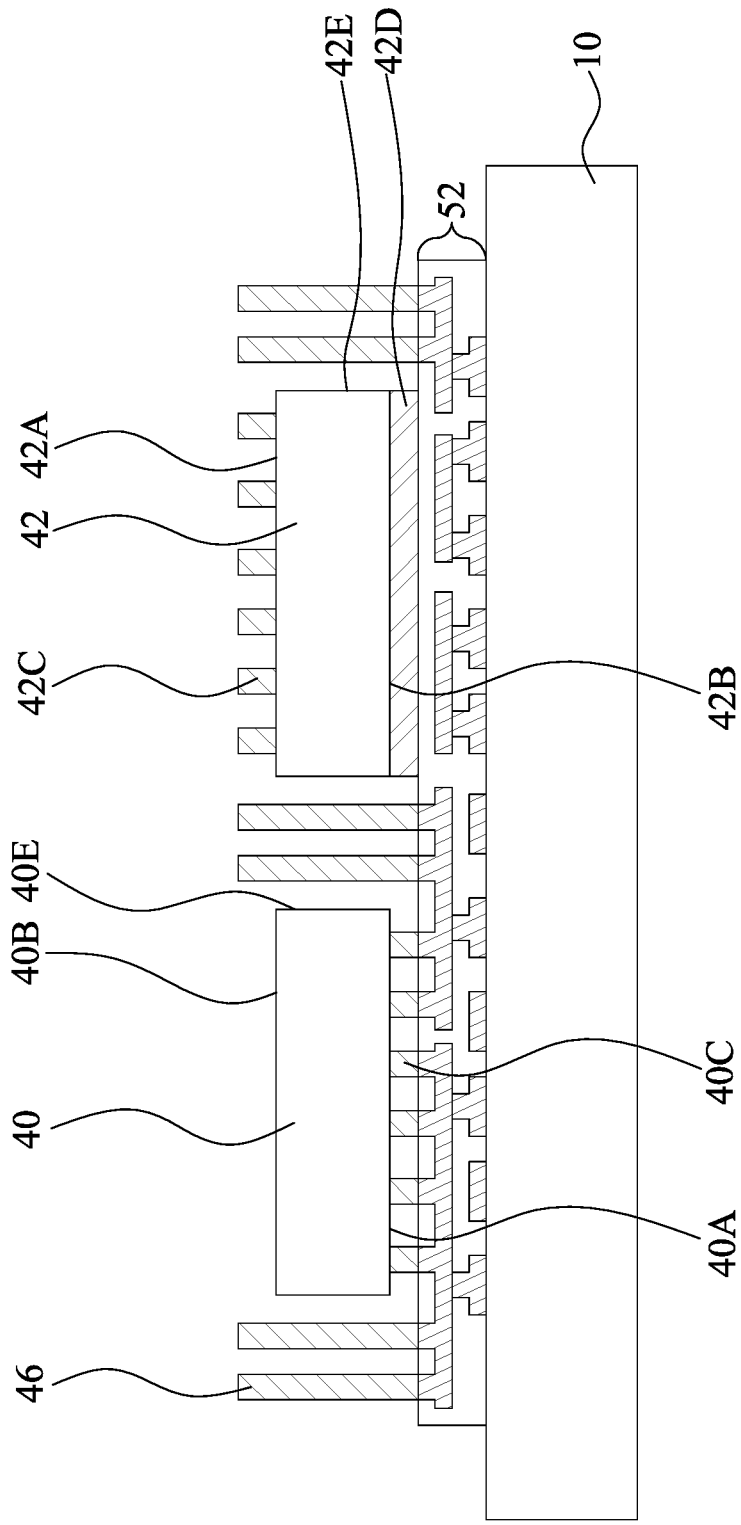

As shown in FIG. 2B, an I/O die 40 is disposed on the second RDL 52. In some arrangements, the I/O die 40 may be flip-chip bonded on the second RDL 52 with the active surface 40A of the I/O die 40 facing the second RDL 52. In some arrangements, a conductive material such as solder material may be used to bond the I/O die 40 and the second RDL 52. In some arrangements, the pitch of the I/O die 40 is fine, and the electrical connection between the I/O die 40 and the second RDL 52 may be implemented in a solder-free manner to meet the fine pitch design. For example, the I/O die 40 and the second RDL 52 may be directly bonded by metal-to-metal bonding, hybrid bonding, or so on. An EIC die 42 is disposed on the second RDL 52. In some arrangements, the EIC die 42 is bonded to the second RDL 52 by a DAF 42D. The electrical connectors 42C and the active surface 42A of the EIC die 42 face away from the second RDL 52. In some arrangements, a plurality of through vias 46 are formed on the second RDL 52.

Figure 2C:
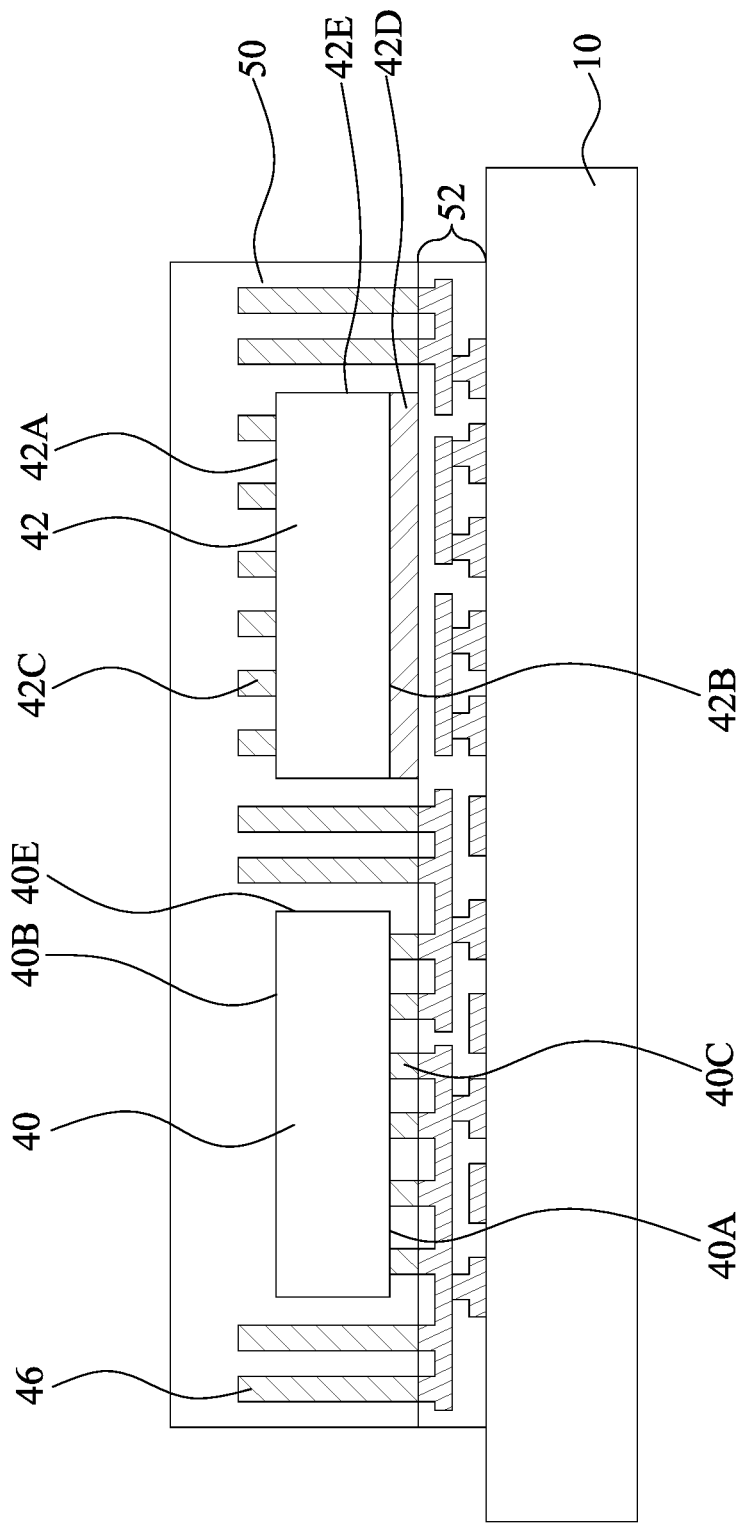
Figure 2D:
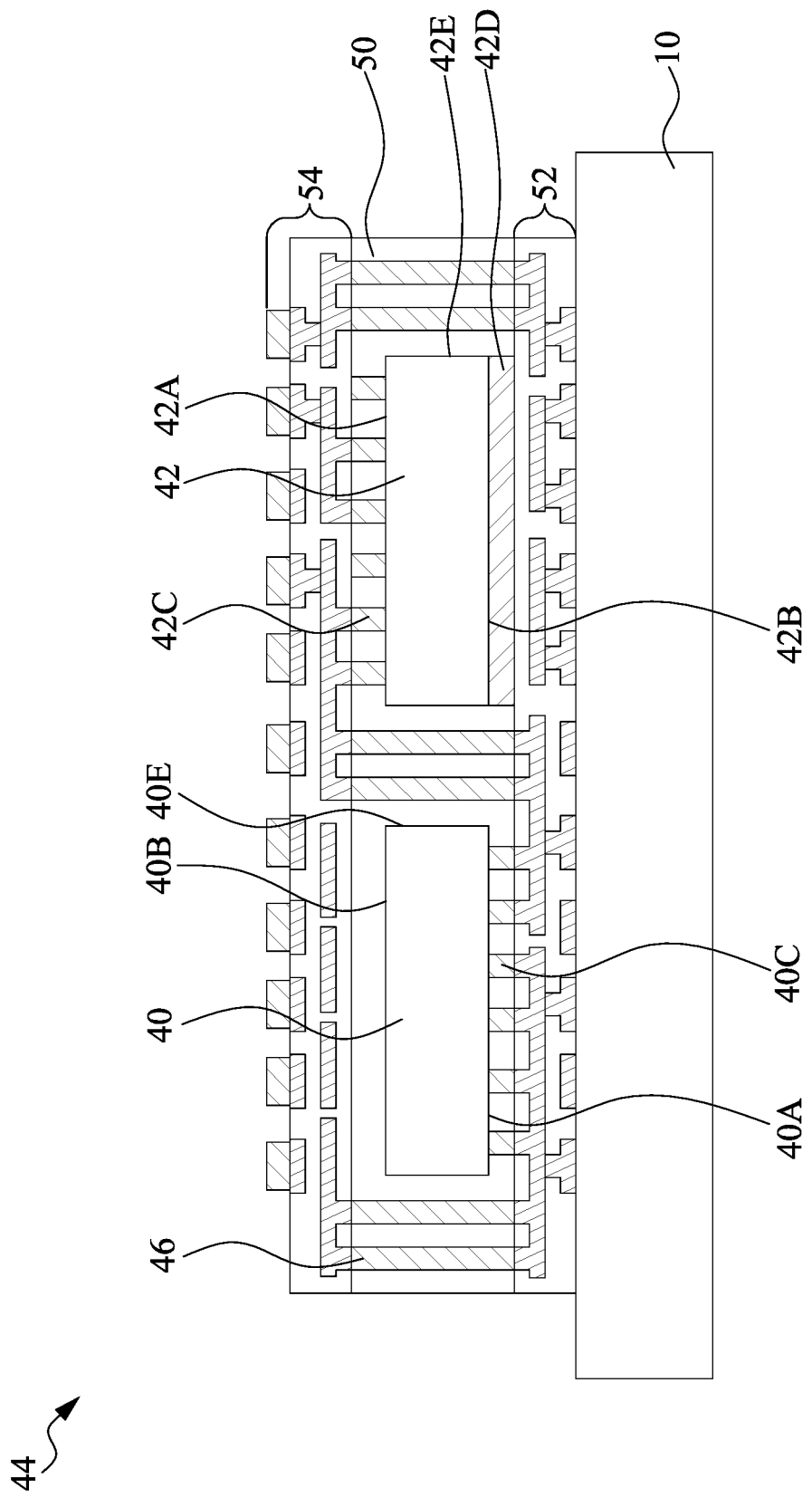

As shown in FIG. 2C, a first encapsulation layer 50 is formed on the second RDL 52 to encapsulate the I/O die 40, the EIC die 42, and the through vias 46. As shown in FIG. 2D, the first encapsulation layer 50 may be truncated by grinding to expose the electrical connectors 42C of the EIC die 42 and the through vias 46. Then, a third RDL 54 is formed on the first encapsulation layer 50 to electrically connect the electrical connectors 42C of the EIC die 42 and the through vias 46. In some arrangements, the third RDL 54 may be formed by alternately stacking conductive layers and dielectric layers. Accordingly, an encapsulated electronic device 44 including the I/O die 40, the EIC die 42, the through vias 46, the second RDL 52, and the third RDL 54 is formed.

Figure 2E:
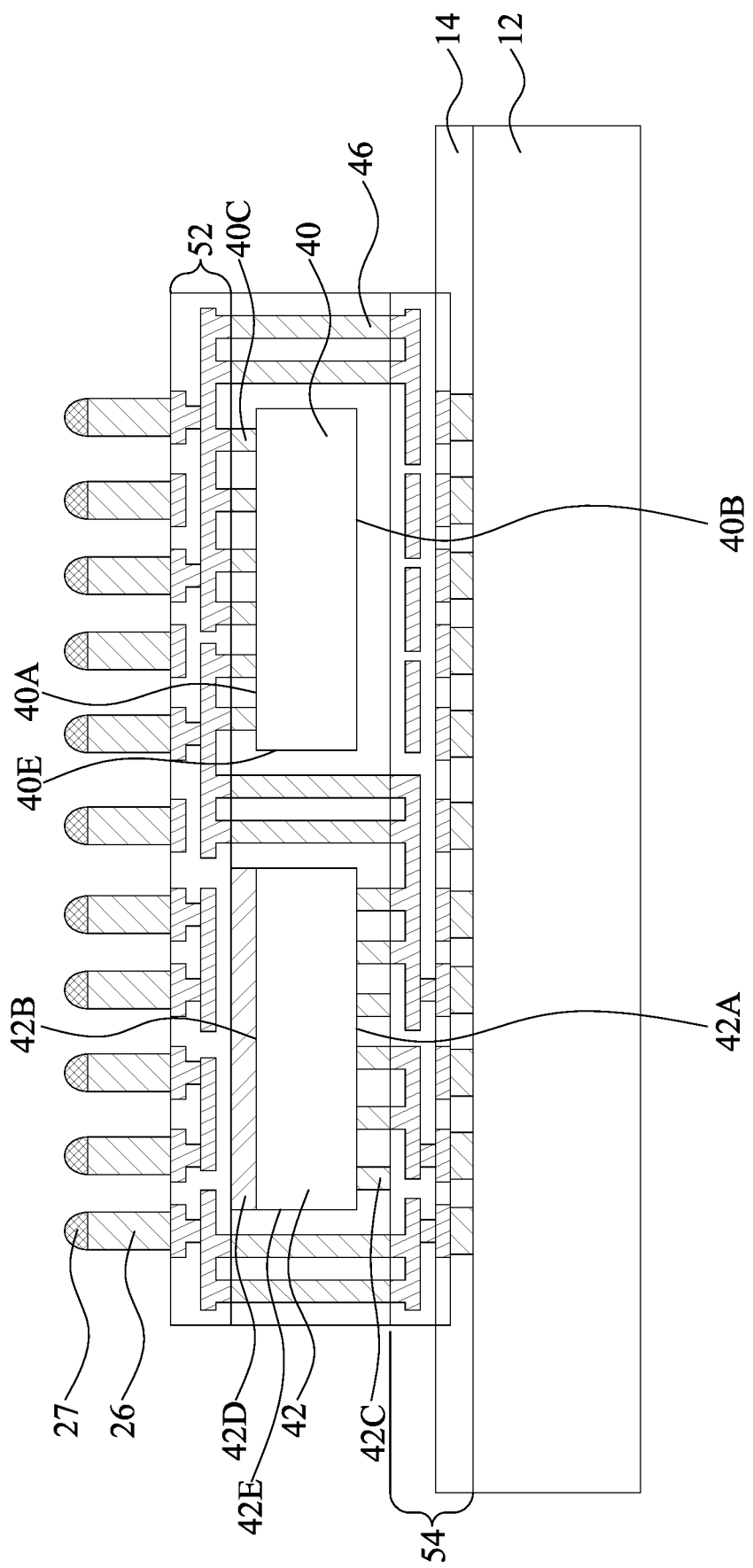

As shown in FIG. 2E, the encapsulated electronic device 44 is released from the carrier 10, and supported by another carrier 12 with the third RDL 54 facing and attached to an adhesive layer 14. Then, electrical connectors 26 are formed on and electrically connected to the second RDL 52. In some arrangements, conductive materials 27 such as solder materials may be formed on the electrical connectors 26.

Figure 3A:
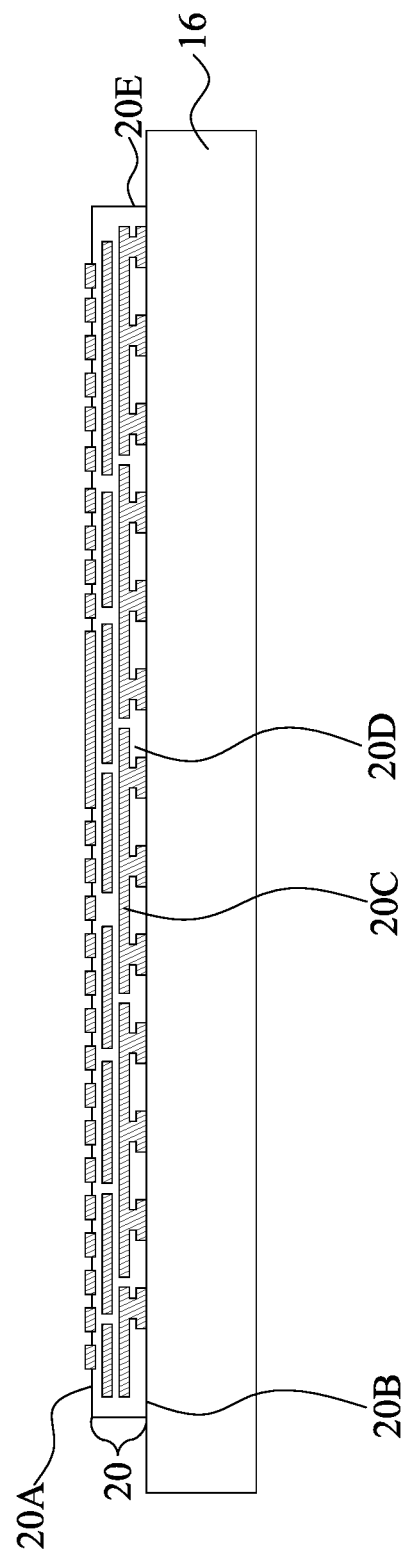
FIG. 3A, FIG. 3B, FIG. 3C, FIG. 3D, FIG. 3E, FIG. 3F and FIG. 3G illustrate operations of manufacturing an optoelectronic device package in accordance with some arrangements of the present disclosure.
Figure 3B:
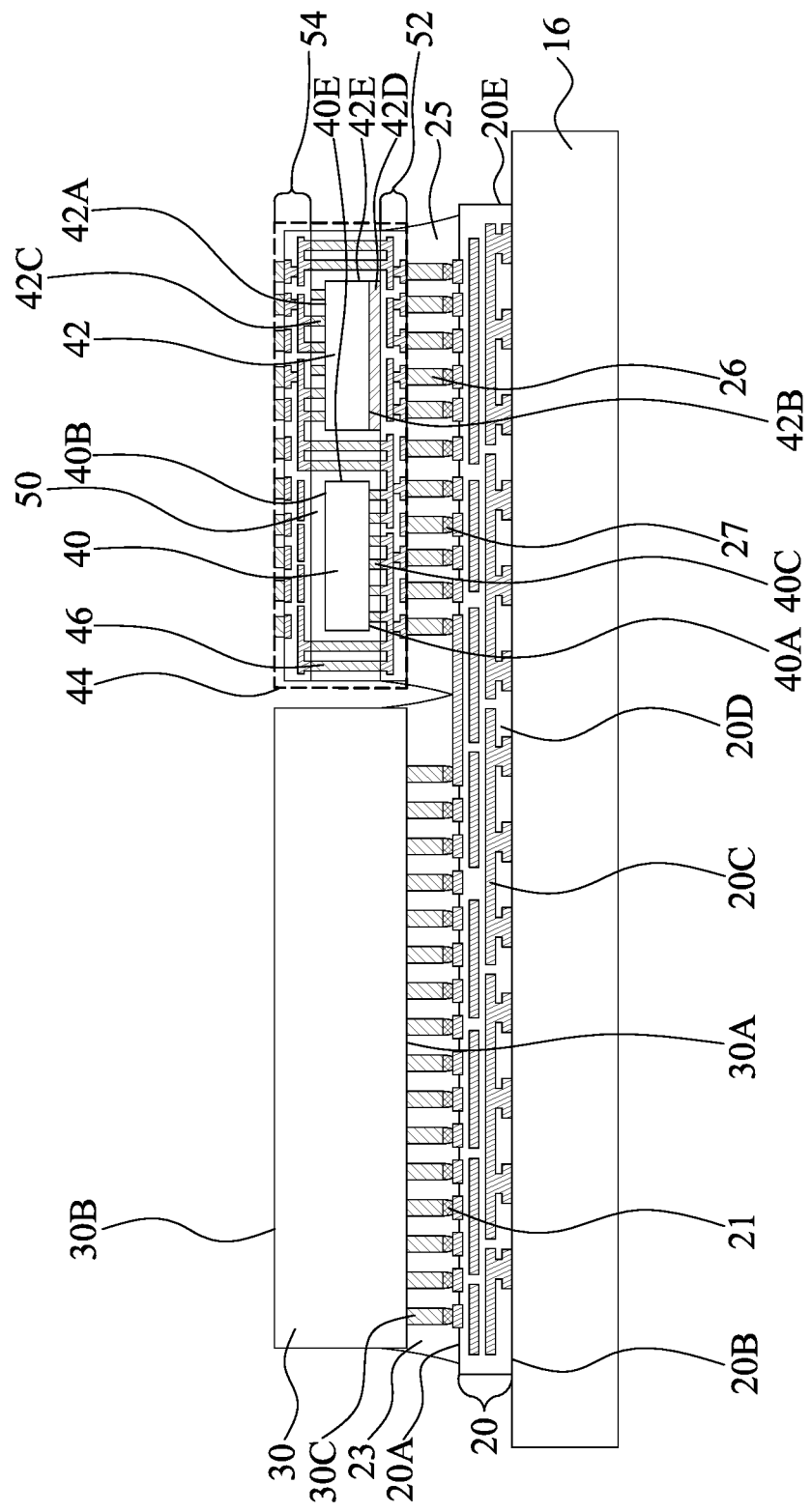

FIG. 3A, FIG. 3B, FIG. 3C, FIG. 3D, FIG. 3E, FIG. 3F and FIG. 3G illustrate operations of manufacturing an optoelectronic device package in accordance with some arrangements of the present disclosure. As shown in FIG. 3A, a carrier 16 is provided. A first RDL 20 is formed on the carrier 16. In some arrangements, the first RDL 20 may be formed by alternately stacking conductive layers and dielectric layers. As shown in FIG. 3B, the encapsulated electronic device 44 is bonded to the first RDL 20 through the conductive materials 27 such as solder material. An underfill layer 25 may be formed to protect the electrical connectors 26 and the conductive material 27. A processing die 30 is provided. The processing die 30 includes electrical connectors 30C facing the first RDL 20, and the processing die 30 is flip chip bonded to the first RDL 20 through a conductive material 21. An underfill layer 23 may be formed to protect the electrical connectors 30C and the conductive material 21. In some arrangements, the pitch of the processing die 30 is fine, and the electrical connection between the processing die 30 and the first RDL 20 may be implemented in a solder-free manner to meet the fine pitch design. For example, the processing die 30 and the first RDL 20 may be directly bonded by metal to metal bonding, hybrid bonding or so on.

Figure 3C:
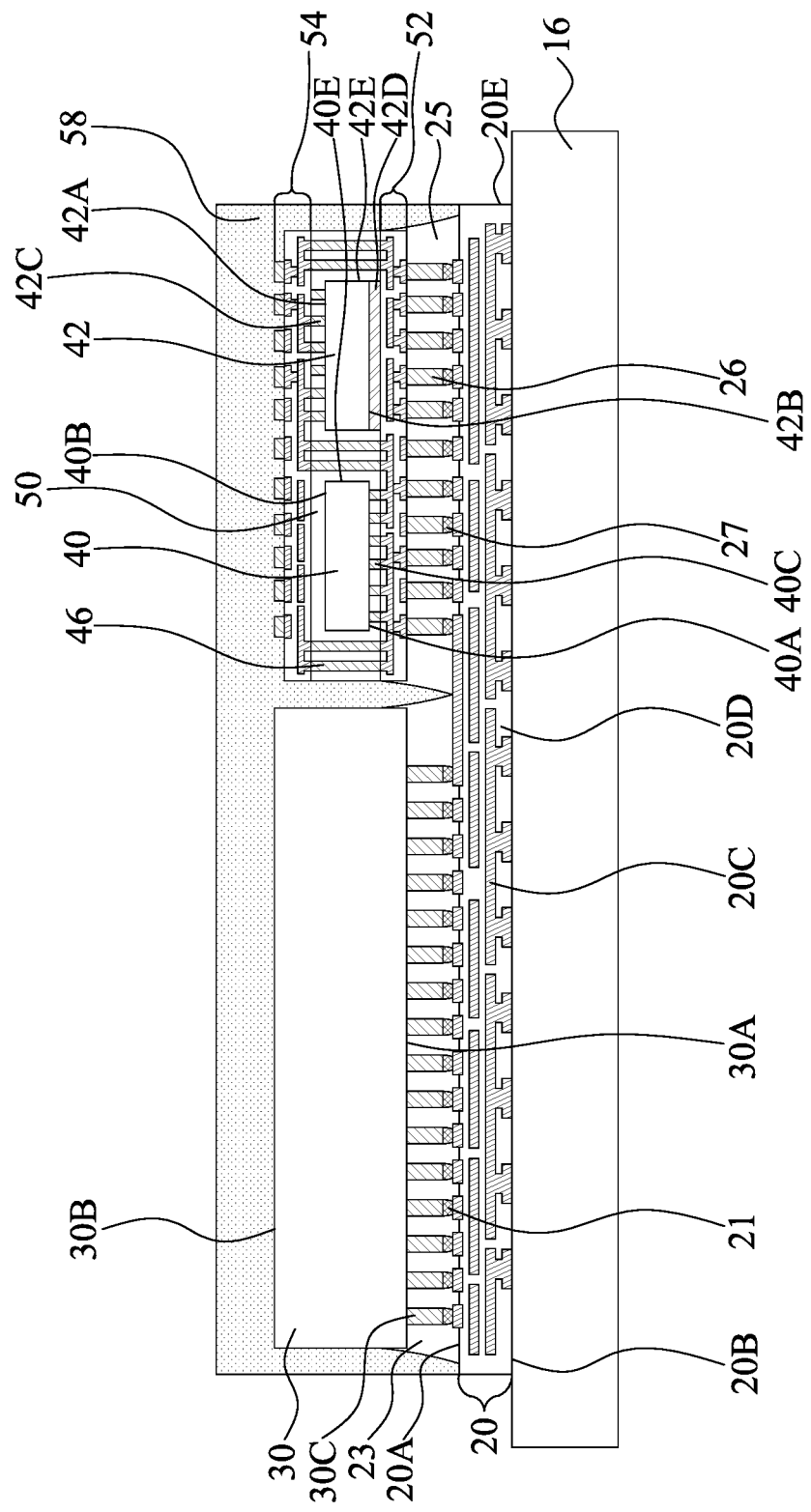
Figure 3D:
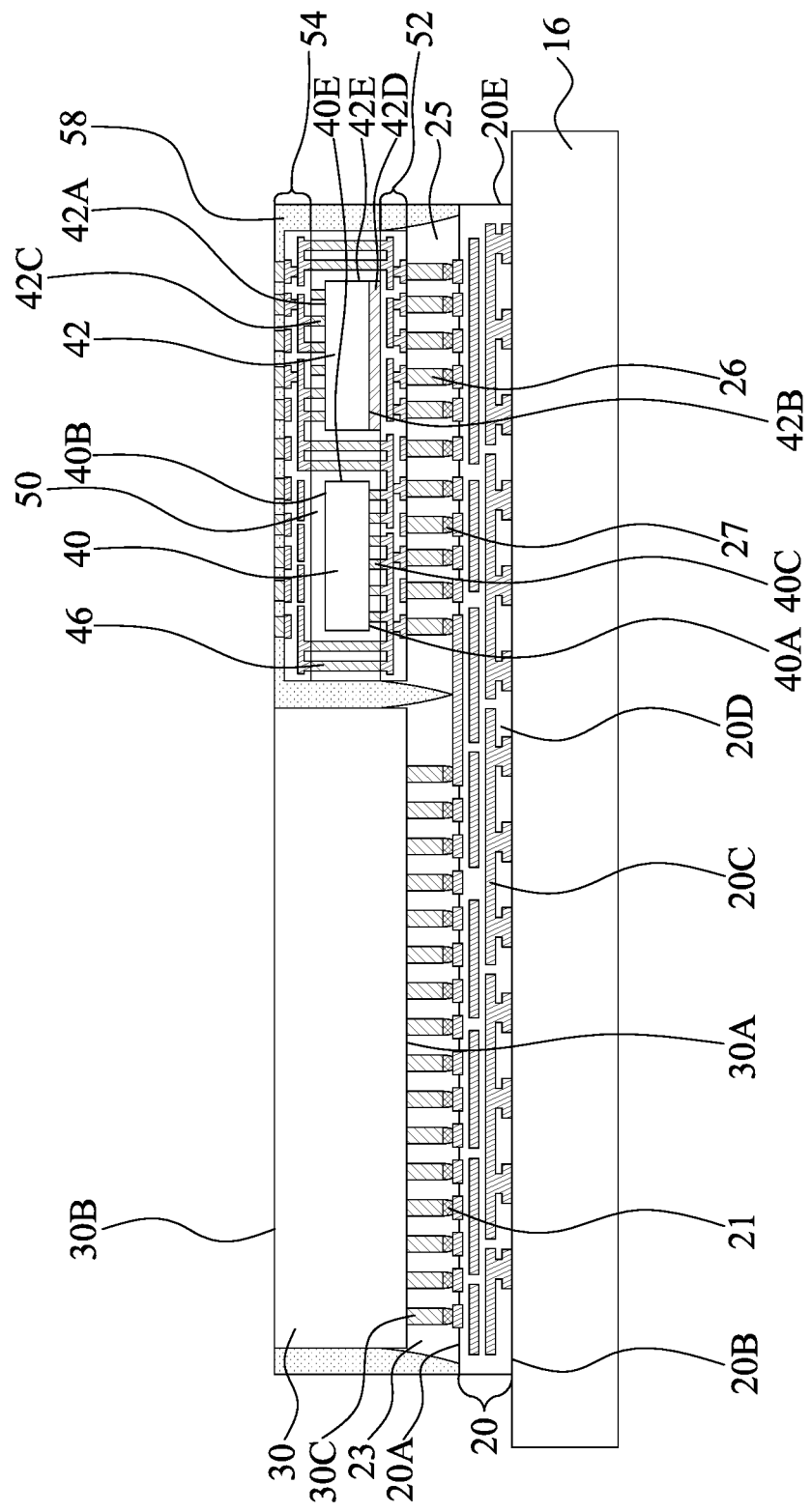

As shown in FIG. 3C, a second encapsulation layer 58 is formed on the first RDL 20 to encapsulate the encapsulated electronic device 44 and the processing die 30. As shown in FIG. 3D, the second encapsulation layer 58 may be truncated by grinding to expose the third RDL 54.

Figure 3E:
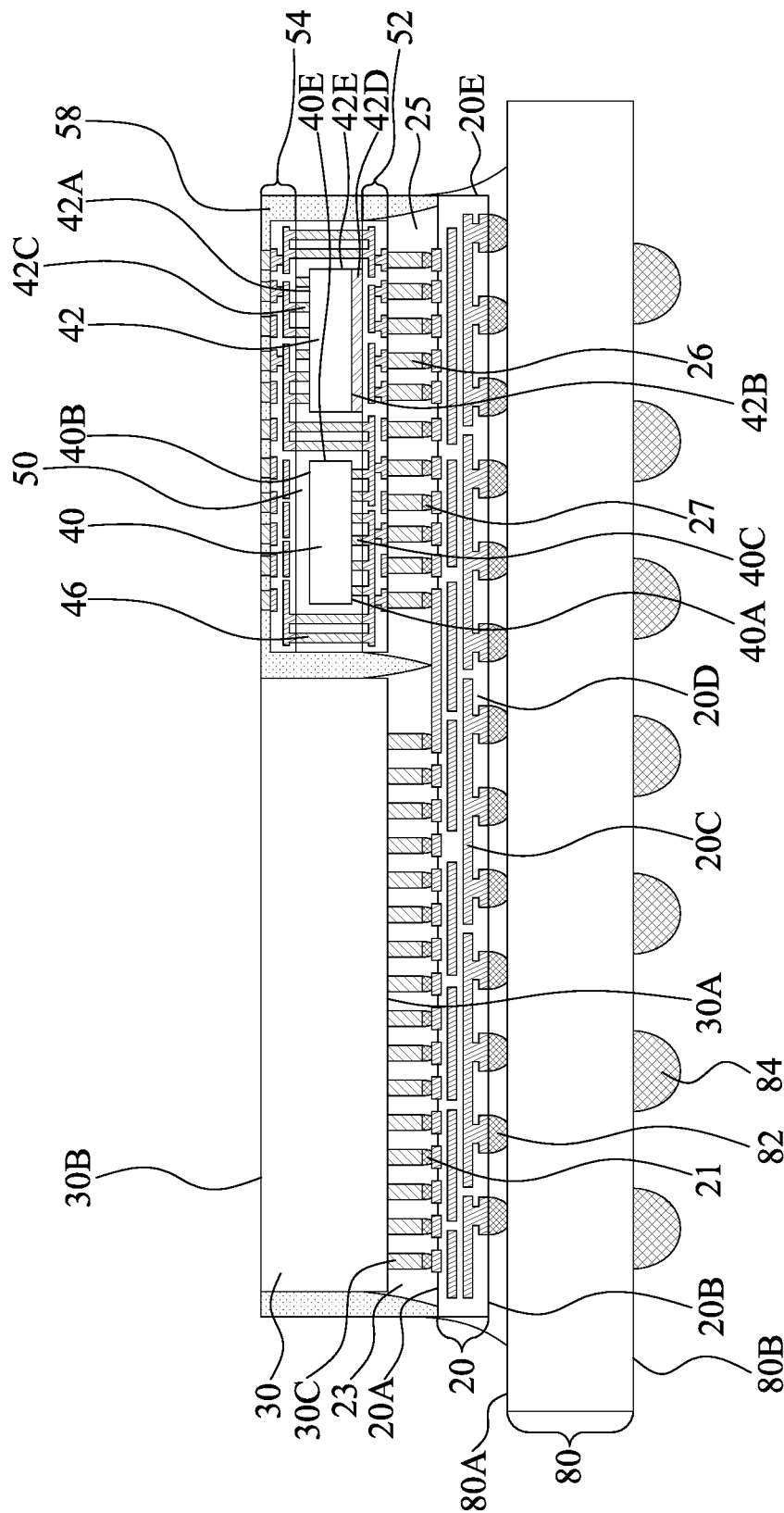
Figure 3F:
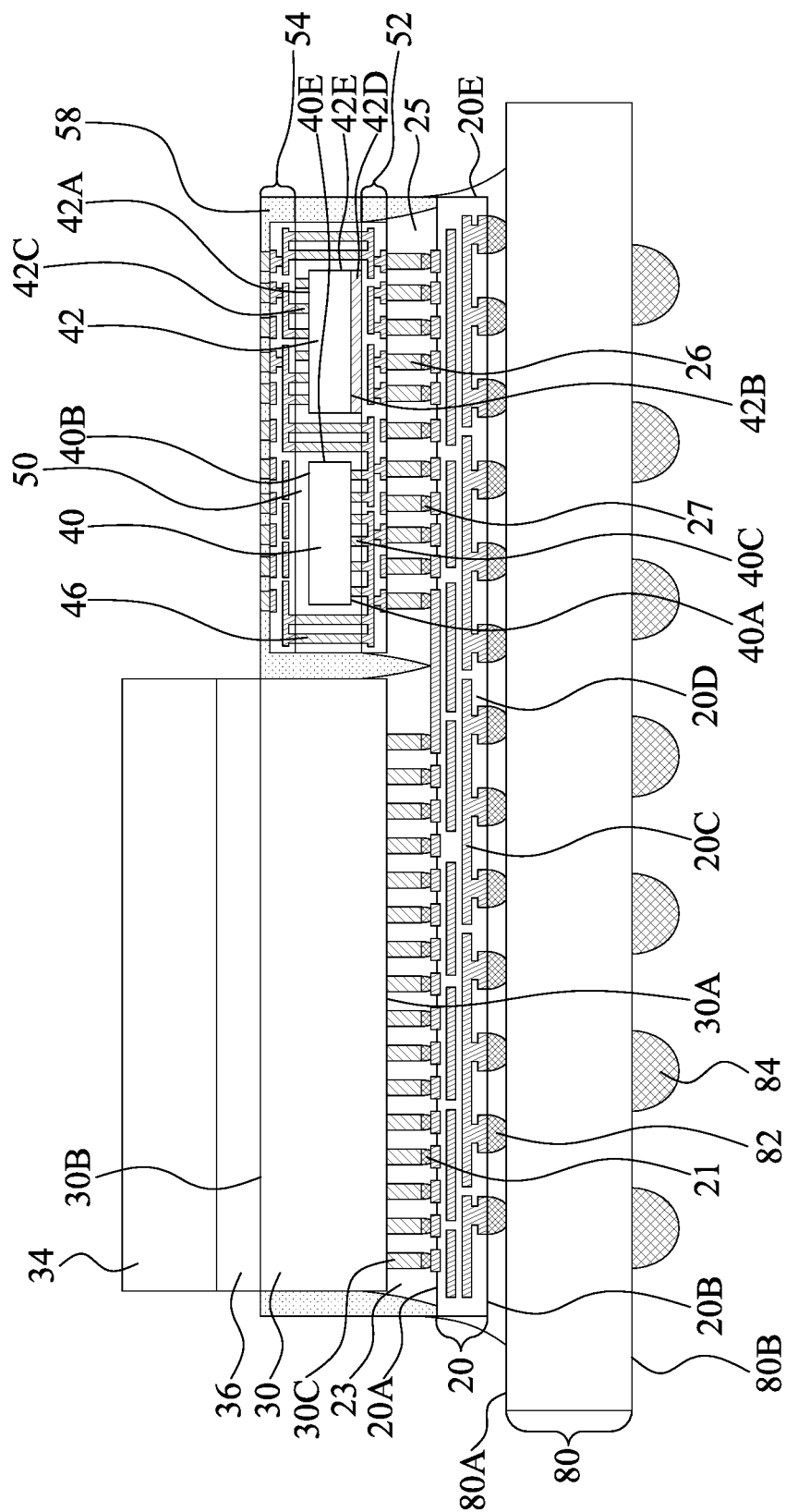
Figure 3G:
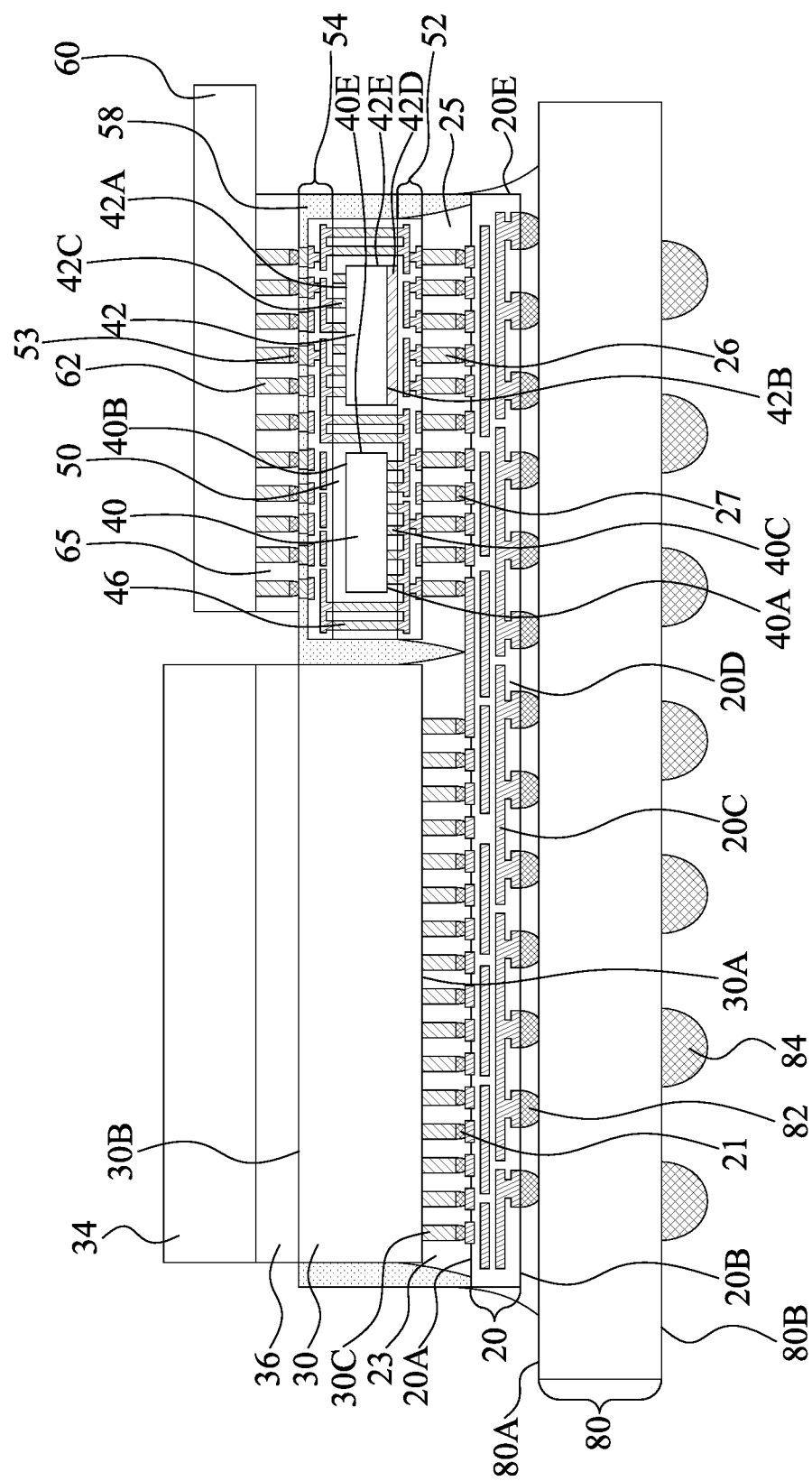

As shown in FIG. 3E, the first RDL 20 is released from the carrier 16, and bonded to a substrate 80 through electrical connectors 82 such as solder connectors. As shown in FIG. 3F, a lid 34 may be adhered to the processing die 30 with a TIM 36. As shown in FIG. 3G, a photonic die 60 may be bonded to the third RDL 54 through electrical connectors 62 and a conductive material 53. An underfill layer 65 may be formed to protect the electrical connectors 62 and a conductive material 53. An optical component 70 such as an optical fiber may be coupled to a portion of the photonic die 60 protruding out an edge of the encapsulated electronic device 44 to form the optoelectronic device package 1 as illustrated in FIG. 1.

In some arrangements of the present disclosure, the processing circuit unit and I/O circuit unit that have different functionalities, technology nodes and areas are manufactured separately to form a processing die and an I/O die, respectively, in order to optimize the performances of the processing circuit unit and I/O circuit unit. The processing die and the I/O die may be both flipped-chip bonded to and communicating through an RDL with fine line width/spacing, and thus high speed parallel signal transmission can be implemented.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some arrangements, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific arrangements thereof, these descriptions and illustrations do not limit the present disclosure. It can be clearly understood by those skilled in the art that various changes may be made, and equivalent components may be substituted within the arrangements without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and so on. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optoelectronic device package, comprising:
a first redistribution layer (RDL);
a processing die disposed over the first RDL;
a first electronic component disposed over the first RDL and electrically connected to the processing die through the first RDL;
a second electronic component disposed over the first RDL,
wherein the first electronic component is disposed between the processing die and the second electronic component, and an edge of the first RDL protrudes out of an outer edge of the second electronic component in a direction away from the first electronic component; and
a photonic die disposed over the second electronic component, wherein a level of an upper surface of the photonic die is higher than a level of an upper surface of the processing die with respect to the first RDL.

2. The optoelectronic device package of claim 1, wherein a technology node of the processing die is less than that of the first electronic component.

3. The optoelectronic device package of claim 1, further comprising:
an encapsulation layer encapsulating the first electronic component and the second electronic component, wherein the encapsulation layer is spaced apart from the processing die.

4. The optoelectronic device package of claim 3, wherein the edge of first RDL protrudes out of an edge of the encapsulation layer in the direction away from the first electronic component.

5. The optoelectronic device package of claim 1, wherein the processing die has an active surface, the second electronic component has an active surface, and the active surface of the processing die is closer to the first RDL than to the active surface of the second electronic component.

6. The optoelectronic device package of claim 1, further comprising: a lid disposed over the processing die by a thermal interface material.

7. The optoelectronic device package of claim 1, further comprising: a protective layer disposed between the processing die and the first RDL.

8. An optoelectronic device package, comprising:
a first redistribution layer (RDL);
a first electronic die disposed over the first RDL and having an active surface;
a second electronic die disposed over the first RDL and having an active surface;
a photonic die disposed adjacent to the second electronic die;
a second RDL under the first electronic die and the second electronic die, wherein the second RDL is connected to the active surface of the first electronic die;
a third RDL over the first electronic die and the second electronic die, wherein the third RDL is electrically connected to the active surface of the second electronic die; and
an underfill layer disposed between the photonic die and the third RDL.

9. The optoelectronic device package of claim 8, wherein the photonic die is disposed over and electrically connected to the second electronic die.

10. The optoelectronic device package of claim 9, wherein the photonic die is electrically connected to the first electronic die and the second electronic die through the third RDL.

11. The optoelectronic device package of claim 10, wherein the photonic die overhangs the third RDL.

12. The optoelectronic device package of claim 8, further comprising:
an encapsulation layer encapsulating the first electronic die and the second electronic die, wherein the encapsulation layer is disposed between the first RDL and the third RDL.

13. The optoelectronic device package of claim 12, further comprising:
a conductive via passing the encapsulation layer and electrically connecting the first RDL and the third RDL.

14. The optoelectronic device package of claim 8, wherein the photonic die is configured to be optically coupled to an optical component.

15. The optoelectronic device package of claim 14, wherein at least a portion of the optical component is disposed under the photonic die.

16. An optoelectronic device package, comprising:
a first redistribution layer (RDL);
a processing die disposed over the first RDL and having an active surface;
a first electronic component disposed over the first RDL and having an active surface; and
a second electronic component disposed over the first RDL and having an active surface and an opposing surface,
wherein the opposing surface of the second electronic component, the active surface of the processing die and the active surface of the first electronic component are misaligned with each other,
and wherein each of an elevation of the opposing surface of the second electronic component and an elevation of the active surface of the first electronic component is higher than an elevation of the active surface of the processing die with respect to the first RDL.

17. The optoelectronic device package of claim 16, further comprising:
 a second RDL disposed between the second electronic component and the first RDL, wherein the second RDL overlaps the processing die along a horizontal direction.

\* \* \* \* \*